Figure 1:
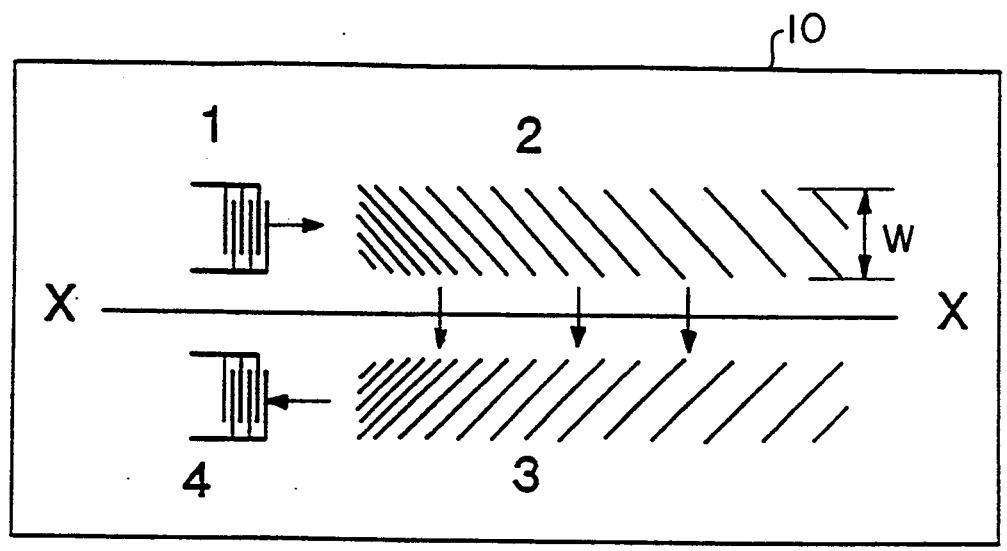

United States Patent [19]

Ronnekleiv

[11] Patent Number: 5,424,697
[45] Date of Patent: Jun. 13, 1995

[54] RESPONSE CORRECTION FOR SAW FILTERS

[75] Inventor: Arne Rønnekleiv, Trondheim, Norway

[73] Assignee: Forbe Radio AS, Trondheim, Norway

[21] Appl. No.: 923,913
[22] PCT Filed: Feb. 27, 1991
[86] PCT No.: PCT/NO91/00028
 § 371 Date: Aug. 28, 1992
 § 102(e) Date: Aug. 28, 1992
[87] PCT Pub. No.: WO91/13492
 PCT Pub. Date: Sep. 5, 1991

[30] Foreign Application Priority Data

Mar. 1, 1990 [NO] Norway .................................. 900965

[51] Int. Cl.⁶ ............................................. H03H 9/64
[52] U.S. Cl. ..................................... 333/195; 310/313
[58] Field of Search ............... 333/150, 152, 153, 193, 333/195; 310/313 R, 313 B, 313 C, 313 D

[56] References Cited

U.S. PATENT DOCUMENTS

| | | | |
|---|---|---|---|
| 4,336,514 | 6/1982 | Paige | 333/153 |
| 4,745,321 | 5/1988 | Raschke | 333/153 |
| 4,916,416 | 4/1990 | Desbois | 333/195 |

FOREIGN PATENT DOCUMENTS 0069919 6/1981 Japan ................................ 333/195

OTHER PUBLICATIONS

Anderson et al, Attenuating Thin Films for SAW Devices Nov. 1980, 442-445.

*Primary Examiner*—Benny Lee
*Attorney, Agent, or Firm*—Cohen, Pontani, Lieberman & Pavane

[57] ABSTRACT

A procedure to correct the amplitude of the frequency or the impulse response for signal processing filter based entirely or partly on acoustic surface waves has been described. The method may be applied where the acoustic wave follows different paths inside the component depending on the signal frequency or on the signal time delay in the filter. The method is based on changing the signal phase in an essentially periodic way for instance by etching metal films placed on the surface of the component in order to make correction possible. Laser induced etching can be an efficient way to carry out amplitude correction according to the invention due to the good geometric resolution of this method and because correction of the phase pan of the response can be earned out with the same equipement in accordance with established techniques.

4 Claims, 1 Drawing Sheet

RESPONSE CORRECTION FOR SAW FILTERS

The present invention relates to the correction of the amplitude response in the time domain or in the frequency domain for a class of linear, reciprocal filters which are based on surface acoustic waves (SAW). The signal is carried in the form of a SAW over the surface of the component. The SAW will follow a path from an input transducer where the SAWs are generated to an output transducer where the SAWs are detected and the signal is made available to the user in electric form. Only a part of each signal carrying SAW is converted to electric form by the output transducer; such part will be referred to part of the useful acoustic signal or saw.

Existing correction methods are based on the fact that the useful acoustic signal follows different paths over the component's surface determined by the signal frequency if the correction is to be made in the frequency domain or dependent on the signal time delay if the correction is made in the time domain.

Correction of the phase response for SAW filter has been done and is being done today by the deposition of a metal film which influences the velocity of the SAW. After electrical measurement of the component's response, part of this metal film may be removed by a deliberate selective etching until a correct phase response has been reached as described by V. S. Dolat, J. H. C. Sedlacek and D. J. Ehrlich in the paper "Laser direct write compensation of reflective array compressors", IEEE 1987 Ultrasonic Symposium Proceedings, p. 203-208.

Correction of the amplitude response for reflector array compressor (RAC) chirp filters has been done earlier by the deposition of a resistance film (CERMET) which will attenuate the SAW as described in the above Dolat et al. paper. After electrical measurement of the response of the RAC filter, the attenuating film has been made partially inactive by laser induced oxidation until a correct amplitude response has been reached. This method requires a strong piezo-electric coupling for the waves in the area where the film is located. This is not possible for RAC chirp lines on quartz, in particular not if the crystal has a so-called ST-cut. As described by M. B. Schulz, B. J. Matsinger and M. G. Holland in the paper "Temperature dependence of surface acoustic wave velocity on alpha-quartz"; J. Appl. Phys, Vol 41, 2755-2765 orientation of the SAW plane related to the crystal axis results in a low temperature dependence of the component, but the crystal cut lacks piezo-electric coupling for SAWs in the transversal direction where the attenuating CERMET film has to be located. Other SAW materials like LiNbO$_3$ has a sufficient piezo-electric coupling, however, it represents a general problem to produce a CERMET film with a suitable resistance and a sufficient stability.

By using the invention, correction of the amplitude response on a time selective or a frequency selective basis is obtained by changing the substrate surface properties in a deliberate pattern transversely to the propagation of the wave to obtain desired SAW velocity changes. These velocity changes have to be made in that area of the surface where the signal path depends on frequency or on time delay. The resulting change in the transfer of the useful signal can be used for amplitude correction of the filter response by a procedure of the present invention that will be described below.

A RAC filter, or in principle any other filter, may also be corrected by making a cascade connection to a correction filter which has been designed to cancel the response errors of the RAC filter to be corrected. This method is described in the U.S. Pat. No. 4,857,870: "Method of manufacturing a surface wave dispersive filter and a filter manufactured in accordance with this method". The additional filter, or the correction filter can be integrated with the primary filter on the same piezo-electric substrate or on an additional substrate dependent on what is the most practical and economic solution. In any case the correction of a filter by the design of a particular correction filter will be a rather expensive method.

One of the other amplitude correction methods is to correct the depths of the reflector grooves after the component has been produced and electrical measurements of the response made. This procedure requires a permanent masking of the ridges between the grooves. This mask serves as an etching mask for the correction etching of the grating without destroying the propagation properties of the SAWs in the reflective array. This procedure requires a high geometric resolution for the etching process along the reflector arrays. An adequate resolution can be difficult to obtain for chirp lines with a high chirp rate, that is a small change in the time delay per unit frequency. The masking of the ridges has disadvantages in that it may result in additional losses and also be a possible source of accelerated aging of the component. It has also been difficult to find suitable material/etch process combinations for an attractive SAW substrate material like LiNbO$_3$.

It is therefore desireable to develop new methods for amplitude correction. For economic reasons it would be preferable to use the same technology and the same equipment for the amplitude correction as is used for the phase correction of the response. This property is obtained by the inventive amplitude correction method.

The invention and the advantages obtained with the invention will be more fully appreciated from the following detailed description when the same is considered in connection with the accompanying drawings, in which FIG. 1 schematically and in principle shows a reflector array compressor "RAC" surface acoustic wave "SAW" chirp filter.

Figure 2:
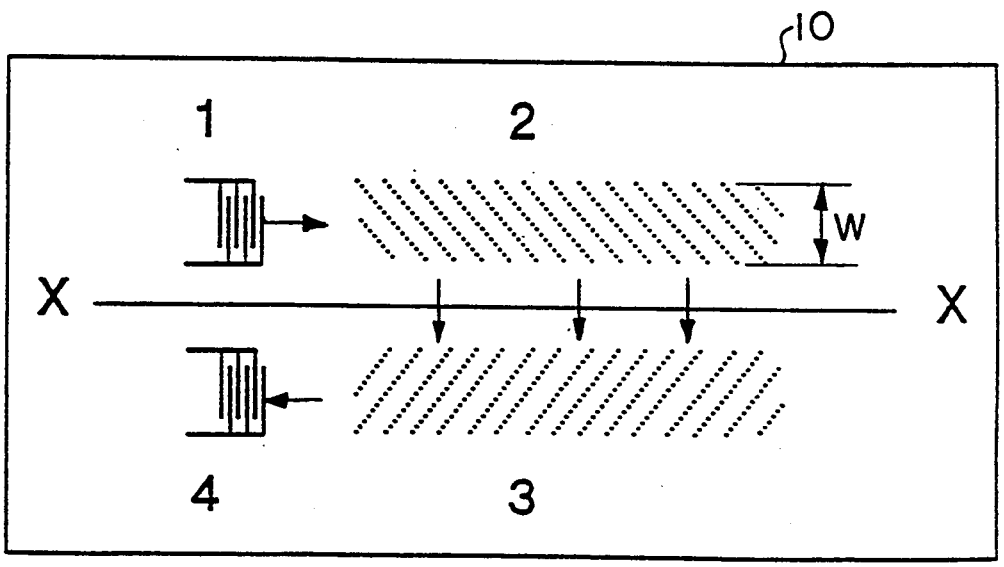

FIG. 2 schematically and in principle shows a reflector dot array "RDA" filter.

The principal function of a RAC filter as shown in FIG. 1 is that the input transducer 1 sends a SAW wave towards an array 2 of reflecting grooves which reflects the waves with a 90° change of direction. The high frequency signals are reflected close to the input transducer 1 and low frequency signal further back into the array. This effect is obtained by increasing the distance between the grooves as one goes further away from the input transducer. The waves propagate towards an other reflecting array 3 which is the mirror image of the first array around the line denoted x—x in FIG. 1. This second array reflects the wave towards the output transducer as described by A. Ronnekleiv in the paper "Amplitude and phase compensation of RAC-type chirp lines on quartz", IEEE 1988 Ultrasonic Symposium Proceedings, pp. 169-173. Signals with different frequency will pass the line x—x at different locations and they will also be subject to different delays through the component. The frequency dependent delay is the primary function of a chirp filter.

The "U-structure RDA"-filter as described by L. P. Solie in the paper "A SAW filter using a reflective dot array (RDA)", IEEE 1976 Ultrasonics Symposium Proceedings, pp. 309–312, is shown in FIG. 2. One difference from the RAC-chirp filter in FIG. 1 is that the individual reflectors in the arrays 2 and 3 instead of being made as grooves, are made as a string of metal dots placed on a straight line. As related to the invention it is a more interesting difference that the reflectors of FIG. 2 are equidistant along the arrays 2 and 3. This implies that they are all effective reflectors in the same frequency range. Hence for the RDA filter structure the signals which pass a line x—x will have the same frequency range, but obtain different time delays dependent on the location where the signals pass the line x—x.

The invention concerns only correction of the amplitude response. We will now establish a relation between phase correction of RAC filters by using existing technology and the inventive method for amplitude correction. To this end we introduce a periodic change of velocity for the waves along the line x—x in the area between the arrays 2 and 3. The period of velocity change is $L_p$ and it has a sine shaped function along the line x—x shown between the arrays 2 and 3 in FIG. 2. In accordance with the aforementioned Volck et al. paper, this change of velocity will result in a corresponding change of phase for the waves passing this area. Let W denote the width of each of the arrays measured orthogonal to the line x—x. If $L_p \geq 2W$ the result will be a periodic change in the phase of the impulse response for the fighter (periodic in time), with period $T_p = L_p/(2 v_1)$ where $v_1$ is the wave velocity measured along the arrays 2 and 3 in the x—x direction. If $L_p$ is made sufficiently large the result will be a change of phase in the frequency response of the filter. This case corresponds to the well known method for phase correction of a RAC filter response. The amplitude change of the impulse response will be negligible.

At or close to the range $2W \geq L_p \geq W/2$, the magnitude of the resulting periodic change of phase for the impulse response will be reduced as we reduce $L_p$. For $L_p = W/2$ the change of phase for the impulse response will be nearly constant and independent of the time delay, and approximately equal to the average value of the phase change measured along the line x—x. The amplitude of the impulse response when $L_p$ is reduced from 2 W will be reduced and stabilized at a level given by the amplitude of the periodic phase change when $L_p$ is reduced to W/2. A further reduction in $L_p$ will not affect the amplitude nor the phase of the impulse response in a significant way before $L_p$ is reduced to a size comparable to the wave-length $\lambda$. If $L_p < \lambda$ the wave propagation will be that of a homogeneous medium. Hence no periodic phase change will occur in the output signal and the amplitude response will assume its original value. The phase change of the impulse response will continue to be constant as a function of the signal time delay but may vary with $L_p$ for $L_p \approx \lambda$ or shorter.

The amplitude change for the impulse response of the filter which occurs at a periodic velocity change and which mainly occurs for $W/2 \geq L_p \geq \lambda$, is the basis of the inventive amplitude correction method. This effect has not been described earlier and hence not suggested used to correct amplitude response. The above V. S. Dolat et al. paper describes phase changes over short isolated areas along the line x—x and observes that these phase changes can be used for phase correction and gives a small local amplitude change. This paper though, does not observe that the amplitude changes can be made uniform over large areas of time delay for the impulse response or large frequency ranges of the frequency response by introducing periodic phase changes with $W/2 \geq L_p \geq \lambda$ along the line x—x of FIG. 1, and they therefore fail to observe that these effects can be attractive also for amplitude correction of RAC filters. The possibility for amplitude correction can be seen from the mode coupling integrals which are to be described in the following text, equations 1 and 2. This formalism has not been proposed in the Dolat et al. paper.

To explain the amplitude correction method applied in the frequency domain, let us consider the signal amplitude along a curve with coordinate x transverse to, but not necessarily orthogonal to the direction of SAW propagation in the area where the useful signal will follow different paths dependent of the frequency. The line x—x in FIG. 1 will be suitable for this purpose. At a given signal frequency let us assume that an electrical signal applied to transducer 1 gives a wave amplitude a(x) along the curve and that a signal applied to the transducer 4 gives a wave amplitude b(x) along the same curve with x denoting the distance from the transducer ends of the arrays 2 and 3. The functions a(x) and b(x) are functions with complex values where the absolute value represents the amplitude of the wave and the phase of the function represents the phase of the wave. The expression $$A_1 = \frac{\int a(x)b(x)dx}{[\int |a(x)|^2 dx \cdot \int |b(x)|^2 dx]^{\frac{1}{2}}} \quad (1)$$

represents a mode coupling loss between the two transducers 1 and 4. The introduction of a velocity change for the useful SAWs in the vicinity of the curve x will change the mode coupling loss. If $L_p$ is large compared to $\lambda$, the effect on the complex wave amplitude will simply be a periodic change in the phase as the waves cross the perturbed area, $\phi(x)$, and the mode coupling loss will now become $$A_2 = \frac{\int a(x)b(x)\exp(j\phi(x))dx}{[\int |a(x)|^2 dx \int |b(x)|^2 dx]^{\frac{1}{2}}} \quad (2)$$

where $\exp(j\phi(x))$ is the exponential function of $j\phi(x)$ and $j = \sqrt{-1}$.

The transmission through the component has now been changed with the ratio $|A_2/A_1|$ in amplitude. By making $a(x) = [b(x)\exp(j\phi))]^*$ (* denoted the complex conjugate), the maximum response of the component is obtained. To reach exactly this value is usually of less interest because the functions a(x) and b(x) are difficult to find in detail and it is hardly possible to maximize the response at several or all frequencies at the same time. On the other hand if $\phi(x)$ has a rapid variation compared to a(x) and b(x) and a mainly periodic variation, $\phi(x)$ may be used to reduce $|A_2 A_1|$ to obtain a desired amplitude correction. The period of $L_p$ should not be made less than approximately one wavelength in the x direction because, for the wave propagation perturbation with such a periodicity, the waves will mainly see a local average value of the propagation parameters. The induced surface perturbations will therefore not show up as phase changes of the waves, and the effective $\phi(x)$ will be close to zero and the losses described by eq. 2 and intended to be used for amplitude correction according to the invention will disappear.

The description above indicates that the phase changes occurs in a narrow belt transverse to the wave propagation direction. This is not a necessity according to the invention in that a wider structure in the direction of the signal propagation can be split into narrow belts which are numbered from 1 to n. Each of these belts allows an independent application of eq. 2 to find a desired effect of the phase change $\phi_n(x)$ in belt No. n as a factor of $(A_2/A_1)_n$, where the transmission properties for the belts 1 to n-1 has been included in the computation of the related attenuation functions. The total correction will be the product of all N sequential corrections. It is obvious that the amplitude correction can be different for two different frequencies only to the degree that the useful SAW follows two different paths through the component or alternatively are influenced in different ways by the SAW material perturbation in an area common to the signals at the two different frequencies.

It is of practical interest to observe that if for two subsequent corrections for the same component $\phi(x)=\phi_1(x)+\phi_2(x)$ where $\phi_1(x)$ and $\phi_2(x)$ both are periodic functions but the functions have no common harmonics (in particular important for the lower harmonics), the two contributions to the amplified reduction factors (see eq. 2) will be independent of each other.

We have so far discussed amplitude correction of the frequency response of a component. In principal the same procedure can be used for amplitude correction of the impulse response of a component. For an impulse response amplitude correction it is required that signals which have different delays through the components will pass the component by more or less different paths.

To obtain a good correction for the impulse response it is preferable that the total frequency response of the component is relatively narrowband and that the major band limitation occurs outside the area where the correction is carried out. To obtain a fairly simple description of the method, band limited signal will be assumed which means that the phase change of the signal in the correction area is reasonably well defined. Once again let x be a coordinate transverse to the wave propagation direction, and let y be a coordinate along the wave direction. a(x, y, $\tau$) is the complex wave amplitude caused by an impulse of the input coupler 1 after a time $\tau$ and b(x, y, $\tau$) the corresponding amplitude caused by an impulse to the output coupler 4 in FIG. 2. In this case the impulse response of the component at a time $\tau$ will be proportional to, wherein n is a time parameter which for a given contribution to the convolution integral (3) gives the time delay seen by the wave through the impulse response a(x,y,$\eta$)

$$\int\int\int a(x,y,\eta)b(x,y,\tau-\eta)dxdyd\eta \qquad (3)$$

It is a consequence of equation 3 that by imposing a variable phase shift $\phi(x)$ for the waves around a given y-coordinate of the material it is possible to influence the amplitude of the impulse response here in the same way as described above for the frequency response. Amplitude correction of the impulse response is therefore possible.

For those cases where a description with a frequency independent phase shift function $\phi(x)$ for the correction is too coarse, it is possible to use a more exact description of the wave propagation effects of the changes based on time delay or frequency dispersive time delay. Also for this more detailed description the effect on amplitude may be found with good accuracy from expressions of the form shown in eq. 3. If the impulse response correction has to be accurate over a wide frequency band, the frequency spectrum of the time delays used when weighted with the amplitude of a and b according to eq. 3, should give a flat frequency response across the desired band at the same time as it reduces the amplitude in a desirable way.

FIG. 2, in which the same reference numerals as before have been used to denote corresponding parts: shows a "U"-structure "RDA"-filter that is well suited for amplitude correction of the impulse response according to the invention rather than frequency response.

The local changes of the velocity which must be introduced in the wave propagation to use the amplitude correction methods described above, may be obtained by placing thin films of metal or other suitable materials on the surface of the component in the area suited for correction. The films will change the wave velocity by shortening electric fields generated due to piezo-electric coupling and/or by loading the surface mechanically. The films may be patterned by standard photolithographic techniques. It is of interest to note that as noted in the aforementioned Dolat et al. paper, molybdenum, Mo, and some other materials (Si, Ti) may be etched by laser induced processes to obtain a desired change of the pattern without disassembly and wet processing of the components. It is also possible and from an acoustic point of view equally effective to deposit patterned films either by the usual photolithographic methods or by locally stimulating deposition of a film from a gas by laser light. Several applications of this technique are described by D. Bäuerle in the book "Chemical Processing with Lasers", Volume 1 of Springers series in Material Sciences. (ISBN 3-540-17147-9, Springer, Berlin, 1986).

The amplitude correction according to the invention will result in undesirable changes of the signal phase. The practical problem associated with this is minor, because the phase can be corrected by established techniques such as those disclosed in the above Dolat et al. paper, which may be carried out with the same production equipment as before.

I claim:

1. An analog surface acoustic wave filter, comprising:
   a surface acoustic wave propagating substrate;
   means including an input transducer on said substrate for launching a surface acoustic wave signal into said substrate for propagation therethrough in response to an electrical signal applies thereto;
   means including an output transducer on said substrate for receiving at least a part of the surface acoustic wave signal therefrom;
   means on said substrate for causing constituent surface acoustic waves of said surface acoustic wave signal to propagate toward said output transducer in a plurality of different paths which are dependent on frequency, each of said paths passing through a predetermined area of the substrate and having at least a portion of a predetermined width, each said predetermined width being the same for all of said different paths; and
   means on said substrate for introducing a controlled deviation, with substantially periodic variation over said predetermined area of said surface, of at least one parameter that determines a uniform surface phase velocity for the surface acoustic wave signal, said controlled deviation varying, in a direction transverse to said different paths, with a period that is at least equal to a wavelength of the acoustic wave signal and at most equal to the predetermined width.

2. An analog surface acoustic wave filter, comprising:
a surface acoustic wave propagating substrate;
means including an input transducer on said substrate for launching a surface acoustic wave signal into said substrate for propagation therethrough in response to an electrical signal applied thereto;
means including an output transducer on said substrate for receiving at least a part of the surface acoustic wave signal therefrom;
means on said substrate for causing constituent surface acoustic waves of said surface acoustic wave signal to propagate toward said output transducer in a plurality of different paths which are dependent on time delay, each of said paths passing through a predetermined area of the substrate and having at least a portion of a predetermined width, each said predetermined width being the same for all of said different paths; and
means on said substrate for introducing a controlled deviation, with substantially periodic variation over said predetermined area of said surface, of at least one parameter that determines a uniform surface phase velocity for the surface acoustic wave signal, said controlled deviation varying, in a direction transverse to said different paths, with a period that is at least equal to a wavelength of the acoustic wave signal and at most equal to the predetermined width.

3. A procedure to correct the amplitude part of the frequency response for analog filters, each filter comprising a surface acoustic wave propagating substrate, an input transducer for launching a surface acoustic wave signal into the substrate in response to an electrical signal applied thereto, and an output transducer for receiving at least a part of the surface acoustic wave signal propagated through the substrate from said input transducer after said surface acoustic wave signal part has followed a plurality of different paths through a predetermined area of the substrate dependent on frequency, each of said different paths having a predetermined width, characterized by the step of introducing a controlled deviation, with substantially periodic variation over the predetermined area of the substrate, of at least one parameter that determines a uniform surface phase velocity for the surface acoustic wave signal, said controlled deviation varying, in a direction transverse to said different paths, with a period that is at least equal to a wavelength of the acoustic wave signal and at most equal to the predetermined width of the different wave paths.

4. A procedure to correct the amplitude part of the impulse response for analog filters, each, filter comprising a surface acoustic wave propagating substrate, an input transducer for launching a surface acoustic wave signal into the substrate in response to an electrical signal applied thereto, and an output transducer for receiving at least a part of the surface acoustic wave signal propagated through the substrate from said input transducer after said surface acoustic wave signal part has followed a plurality of different paths through a predetermined area of the substrate dependent on time delay, each of said different paths having a predetermined width, characterized by the step of introducing a controlled deviation, with substantially periodic variation over the predetermined area of the substrate, of at least one parameter that determines a uniform surface phase velocity for the surface acoustic wave signal, said controlled deviation varying, in a direction transverse to said different paths, with a period that is at least equal to a wavelength of the acoustic wave signal and at most equal to the predetermined width of the different wave paths.

* * * * *

UNITED STATES PATENT AND TRADEMARK OFFICE
CERTIFICATE OF CORRECTION

PATENT NO. : 5,424,697
DATED : June 13, 1995
INVENTOR(S) : Arne Ronnekleiv

It is certified that error appears in the above-identified patent and that said Letters Patent is hereby corrected as shown below:

On the title page, item:

"[73] Assignee: Forbe Radio AS, Trondheim, Norway" to

--[73] Assignee: Frobe Radio AS, Trondheim, Norway--

Signed and Sealed this

Twenty-sixth Day of March, 1996

Attest:

BRUCE LEHMAN

Attesting Officer   Commissioner of Patents and Trademarks